(12) United States Patent
Greene (10) Patent No.: US 7,991,363 B2
(45) Date of Patent: Aug. 2, 2011

(54) TUNING MATCHING CIRCUITS FOR TRANSMITTER AND RECEIVER BANDS AS A FUNCTION OF TRANSMITTER METRICS

(75) Inventor: Matthew R. Greene, Crystal Lake, IL (US)

(73) Assignee: Paratek Microwave, Inc., Nashua, NH (US)

( * ) Notice: Subject to any disclaimer, the term of this patent is extended or adjusted under 35 U.S.C. 154(b) by 688 days.

(21) Appl. No.: 11/940,309

(22) Filed: Nov. 14, 2007

(65) Prior Publication Data
US 2009/0121963 A1 May 14, 2009

(51) Int. Cl.
*H04B 1/38* (2006.01)
(52) U.S. Cl. ............... 455/73; 455/67; 455/69; 455/77; 455/125
(58) Field of Classification Search .......... 455/522, 455/69, 67.16, 73, 77, 125, 178.1, 191.1, 455/193.2
See application file for complete search history.

(56) References Cited

U.S. PATENT DOCUMENTS

| | | | |
|---|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,493,112 A | 1/1985 | Bruene |
| 4,799,066 A | 1/1989 | Deacon |
| 5,032,805 A | 7/1991 | Elmer |
| 5,142,255 A | 8/1992 | Chang |

(Continued)

FOREIGN PATENT DOCUMENTS

EP 0909024 9/1998

(Continued)

OTHER PUBLICATIONS

Ida et al., "An Adaptive Impedence Matching System and Its Application to Mobile Antennas," TENCON 2004, IEEE Region 10 Conference, Nov. 21-24, 2004, pp. 543-547.

*Primary Examiner* — Tuan Pham
(74) *Attorney, Agent, or Firm* — Andrew Gust; Guntin Meles & Gust, PLC (57) ABSTRACT

A tunable matching circuit is adjusted primarily based on transmitter oriented metrics and is then applied to attain a desired tuning for transmitter and receiver operation. In a TDM system, this is accomplished by identifying an optimal tuning for the transmitter and then applying an empirically derived adjustment to the tuning circuit in receiver mode. In an FDM system, this is accomplished by identifying a target operation that is a compromise between transmitter performance and receiver performance, and then adjusting the tuning circuit as a function of transmitter metrics and the current tuning values to achieve the desired compromised performance.

23 Claims, 8 Drawing Sheets

U.S. PATENT DOCUMENTS

| | | |
|---|---|---|
| 5,195,045 A | 3/1993 | Keane |
| 5,200,826 A | 4/1993 | Seong |
| 5,212,463 A | 5/1993 | Babbitt |
| 5,258,728 A | 11/1993 | Taniyoshi |
| 5,301,358 A | 4/1994 | Gaskill |
| 5,307,033 A | 4/1994 | Koscica |
| 5,312,790 A | 5/1994 | Sengupta |
| 5,334,958 A | 8/1994 | Babbitt |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,561,407 A | 10/1996 | Koscica |
| 5,564,086 A | 10/1996 | Cygan |
| 5,593,495 A | 1/1997 | Masuda |
| 5,635,433 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,778,308 A | 7/1998 | Sroka |
| 5,786,727 A | 7/1998 | Sigmon |
| 5,830,591 A | 11/1998 | Sengupta |
| 5,846,893 A | 12/1998 | Sengupta |
| 5,874,926 A | 2/1999 | Tsuru |
| 5,886,867 A | 3/1999 | Chivukula |
| 5,990,766 A | 11/1999 | Zhang |
| 6,009,124 A | 12/1999 | Smith |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,133,883 A | 10/2000 | Munson |
| 6,377,142 B1 | 4/2002 | Chiu |
| 6,377,217 B1 | 4/2002 | Zhu |
| 6,377,440 B1 | 4/2002 | Zhu |
| 6,404,614 B1 | 6/2002 | Zhu |
| 6,414,562 B1 | 7/2002 | Bouisse |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,657,595 B1 | 12/2003 | Phillips |
| 6,710,651 B2 | 3/2004 | Forrester |
| 6,759,918 B2 | 7/2004 | Du Toit |
| 6,765,540 B2 | 7/2004 | Toncich |
| 6,774,077 B2 | 8/2004 | Sengupta |
| 6,795,712 B1 | 9/2004 | Vakilian |
| 6,825,818 B2 | 11/2004 | Toncich |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,905,989 B2 | 6/2005 | Ellis |
| 6,920,315 B1 | 7/2005 | Wilcox |
| 6,946,847 B2 | 9/2005 | Nishimori |
| 6,961,368 B2 | 11/2005 | Dent |
| 6,993,297 B2 | 1/2006 | Smith |
| 7,009,455 B2 | 3/2006 | Toncich |
| 7,071,776 B2 | 7/2006 | Forrester |
| 7,113,614 B2 | 9/2006 | Rhoads |
| 7,151,411 B2 | 12/2006 | Martin |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,339,527 B2 | 3/2008 | Sager |
| 7,426,373 B2 | 9/2008 | Clingman |
| 7,535,312 B2 | 5/2009 | McKinzie |
| 2002/0191703 A1 | 12/2002 | Ling |
| 2002/0193088 A1 | 12/2002 | Jung |
| 2003/0060227 A1* | 3/2003 | Sekine et al. .................. 455/550 |
| 2003/0232607 A1 | 12/2003 | Le Bars |
| 2004/0009754 A1* | 1/2004 | Smith, Jr. ........................ 455/82 |
| 2004/0137950 A1 | 7/2004 | Bolin |
| 2004/0202399 A1 | 10/2004 | Kochergin |
| 2004/0257293 A1 | 12/2004 | Friedrich |
| 2005/0042994 A1 | 2/2005 | Otaka |
| 2005/0093624 A1 | 5/2005 | Forrester et al. |
| 2005/0215204 A1 | 9/2005 | Wallace |
| 2005/0282503 A1 | 12/2005 | Onno |
| 2006/0160501 A1 | 7/2006 | Mendolia |
| 2006/0183442 A1 | 8/2006 | Chang et al. |
| 2006/0281423 A1 | 12/2006 | Caimi |
| 2007/0013483 A1 | 1/2007 | Stewart |
| 2007/0042734 A1 | 2/2007 | Ryu |
| 2007/0080888 A1 | 4/2007 | Mohamadi |
| 2007/0142014 A1* | 6/2007 | Wilcox ...................... 455/276.1 |
| 2007/0197180 A1* | 8/2007 | McKinzie et al. ......... 455/248.1 |
| 2008/0055016 A1 | 3/2008 | Morris |
| 2008/0158076 A1 | 7/2008 | Walley |

FOREIGN PATENT DOCUMENTS

| | | |
|---|---|---|
| JP | 03276901 | 3/1990 |
| JP | 10209722 | 8/1998 |

* cited by examiner

TUNING MATCHING CIRCUITS FOR TRANSMITTER AND RECEIVER BANDS AS A FUNCTION OF TRANSMITTER METRICS

BACKGROUND OF THE INVENTION

The present invention is directed towards impedance matching circuits and more particularly, adaptive impedance matching circuits to improve transceiver operation in a variety of scenarios.

As more technology and features are incorporated into small packages, engineering teams must get more and more creative, especially in the face of lagging miniaturization of parts and components. One of the areas that engineers focus on is multipurpose circuitry or, circuitry that meets a variety of functions. A good example of this focus is with regards to antenna matching circuits within cellular telephone devices.

Cellular telephone devices have migrated from single cellular technology supporting devices to multi-cellular technology devices integrating a variety of other consumer features such as MP3 players, color displays, games, etc. Thus, not only are the cellular telephone devices required to communicate at a variety of frequencies, they are also subjected to a large variety of use conditions. All of these factors can result in a need for different impedance matching circuits for the antenna. However, by utilizing tunable components, a single matching circuit can be used under a variety of circumstances.

Tunable matching circuits generally operate to adjust the impedance match with an antenna over a frequency range to maximize the output power. However, difficulties arise when attempting to tune the matching circuit for signal reception. What is needed in the art is an adaptive impedance matching module that can operate to optimize performance of both the transmitter and the receiver under a variety of circumstances. Further, what is needed is an adaptive impedance matching module that optimizes performance of the transceiver based on optimizing the operation in view of a figure of merit.

BRIEF SUMMARY OF THE INVENTION

In general, embodiments of the invention include a tunable matching circuit and an algorithm for adjusting the same. More particularly, the tuning circuit is adjusted primarily based on transmitter oriented metrics and is then applied to attain a desired tuning for both transmitter and receiver operation. In a time division multiplexed (TDM) system in which the transmitter and the receiver operate at different frequencies but are only keyed in their respective time slots (i.e. transmit time slot and receive time slot), this is accomplished by identifying an optimal tuning for the transmitter and then adding an empirically derived adjustment to the tuning circuit in receive mode. In a frequency division multiplexed (FDM) system in which the transmitter and receiver operate simultaneously and at different frequencies, this is accomplished by identifying a target operation for the transmitter, and then adjusting the tuning circuit first to the target value for the transmitter and then adjusting the values to approach a compromised value proximate to an equal or desired target value for the receiver.

An exemplary embodiment of the present invention provides a method for controlling a matching circuit for interfacing an antenna with a transceiver. The matching circuit includes one or more tunable components. The tuning of the matching circuit is based on a figure of merit that incorporates one or more operation metrics. One aspect of the present invention is that the operation metrics can be transmitter based but still provide desired adjustment results for receiver operation. The operation metric(s) is monitored and measured and then compared to the figure of merit. If the desired operation is not attained, the variable component(s) of the matching circuit is adjusted using one or more of a variety of techniques to attain the figure of merit. This process is performed to maintain operation at the figure of merit.

In one embodiment of the invention more particularly suited for TDM systems, an offset, scaling factor, translation or other change or modification is applied to the adjustments of the variable components when switching from the transmit mode to the receive mode. This translation is a function of the values obtained while adjusting during the transmit time slot. The translation is then removed upon return to the transmitter mode and the adjustment process is resumed.

In another embodiment of the invention particularly suited for FDM systems, the figure of merit not only incorporates the transmit metrics, but also incorporates an element to attain a compromise between optimal transmitter and optimal receiver operation. This is accomplished by identifying a target operation goal, such as a desired transmitter and receiver reflection loss and then identifying an operational setting that is a close compromise between the two. This embodiment thus incorporates not only transmitter metrics but also tuning circuit settings or preferences into the algorithm. The tuning preferences can be empirically identified to ensure the desired operation.

These and other aspects, features and embodiments of the present invention will be more appreciated upon review of the figures and the detailed description.

DETAILED DESCRIPTION OF THE INVENTION

The present invention, as well as features and aspects thereof, is directed towards providing an impedance matching circuit, module or component that in response to sensing the matching condition by monitoring one or more metrics or parameters of the transmitter, can be adjusted to optimize the match.

More specifically, embodiments of the present invention include adaptive impedance matching circuits, modules, IC's etc., that operate to sense the matching condition of the transmit signal or other transmitter related metric and then optimizes the matching characteristics by adjusting the values of one or more tunable devices in view of attaining or reaching a figure of merit. The figure of merit can be based on a variety of elements, such as the input return loss, output power, current drain, linearity metrics, as well as others. In the embodiments of the present invention that are presented herein, the figure of merit is typically described or defined as being based on the input return loss. However, it is to be understood that this is just a non-limiting example of the present invention, and although it may in and of itself be considered as novel, other transmitter, or non-receiver, related metrics may be incorporated into the figure of merit in addition to or in lieu of the input return loss or reflection loss.

In an exemplary embodiment, an adaptive impedance matching module (AIMM) detects transmitter related metrics and optimizes the matching circuit keyed on the transmit signal. A benefit associated with focusing on the transmit signal, as well as other transmitter metrics, is that the transmit signal is higher in power than the receive signal and thus, is easier to detect. However, it will be appreciated by those skilled in the art that it is desirable to improve the matching conditions for both the transmit signal and the receive signal. Advantageously, the present invention operates to optimize a figure of merit that achieves a desired operation of both signals even though the matching adjustments performed by the AIMM are only based on sensing the transmitter related metrics.

One embodiment of the invention is particularly well suited for operating in a time division multiplexed (TDM) system. In a TDM system, the radio transmits and receives in different time slots. Typically, the transmitter and receiver also operate on different frequencies; however, it will be appreciated that some systems utilize the same frequency for transmission and reception. Nonetheless, in a TDM system, the transmitter and receiver are not active at the same time. In this environment, the AIMM can be adjusted to optimal settings for the transmitter during a transmit time slot and then the AIMM can be adjusted to optimal setting for the receiver during the receive time slot. As such, the AIMM tuner can be set differently during transmit and receive time slots. During the transmit time slot, an adjustment algorithm is applied to determine the appropriate settings of the AIMM to optimize the match or attain a figure of merit that results in achieving or approaching a desired level of operation. Because any frequency offset between the transmit signal and the receive signal is known, an adjustment or modification of the setting of the AIMM in the form of a translation or some other function is applied to the AIMM during the receive time slot. The adjustment improves the matching characteristics at the receiver frequency based on knowledge determined during the transmit time slot and the general operation of the receiver. During the next transmit time slot, the translation is removed from the AIMM and the adjustment algorithm regains control of the AIMM. Upon returning to the receive time slot, the modification can be reapplied or, if the settings during the transmit time slot have been changed, then the new settings can be modified for the subsequent receive time slot.

The adjustment applied to the AIMM during the receive time slot can be obtained in a variety of manners. For instance, in one embodiment the adjustment may be a translation derived empirically by characterizing the tuner at the transmitter and receiver frequencies and then deriving a mapping function to describe the translation. Alternatively, the translation may be derived by using the known (or theoretical) S-parameters of the tuner network.

Another embodiment of the present invention is particularly suited for a Frequency Division Multiplexed (FDM) system. In an FDM system, the radio transmits and receives at the same time but at different frequencies. Unlike the embodiment suited for a TDM application, the FDM application requires the AIMM to use the same tuning condition for both transmitter and receiver operation. In this embodiment, the tuner is adjusted to provide a desired compromise between matching at the transmit frequency and matching at the receive frequency. It will be appreciated that this compromise could be attained by simply defining a figure of merit that incorporates both a transmitter metric and a receiver metric. However, as previously mentioned, the receive signal is typically lower than the transmit signal and as such, it may be difficult to accurately sense and use as a metric.

Thus, in this embodiment, non-receiver related metrics are used to find a desired compromised state for tuning the AIMM. It will be appreciated that the desired compromised state can vary based on embodiment and operational requirements. For instance, in some embodiments, transmission of data may be more important than reception and as such, preference may be given to optimizing the transmitter. Such a situation may exist in an emergency radio system that is used by people in the field and that need to report back to a central location, but are not necessarily dependent upon information from that central location. In other embodiments, the reception of data may be more important than the transmission. For instance, the reception of weather related information as an emergency warning system. In such an embodiment, preference may be given to optimizing the receiver. Yet in other embodiments, both the reception and transmission of data may be equally important and as such, a setting that gives a compromised performance or attempts to equalize the performance of both the transmitter and receiver is desired. Such an embodiment is typical of cellular telephone operation.

The FDM suitable embodiments of the present invention operate to obtain a desired level of operation based on one or more transmitter related metrics, and also incorporate known characteristics about the tuning circuits to achieve the desired operating state. The desired operating state typically reflects a state of operation that is a compromise from the optimal states for the transmitter and receiver. For instance, one embodiment of the present invention may include the tuning states of the tunable devices in the matching circuit within a transmit signal based figure of merit. Advantageously, this aspect of the present invention enables improved performance in the receive band without having to take a receiver measurement.

Another embodiment of the invention deployable within an FDM environment is to tune the matching circuit to a figure of merit that is based on a vector measurement of the transmitter reflection coefficient. In this embodiment, the phase information in the vector measurement is incorporated into the figure of merit and the optimal compromise between the transmitter and receiver operation occurs at a particular phase of the transmitter reflection coefficient.

Now turning to the figures, the various embodiments, features, aspects and advantages of the present invention are presented in more detail.

Figure 1:
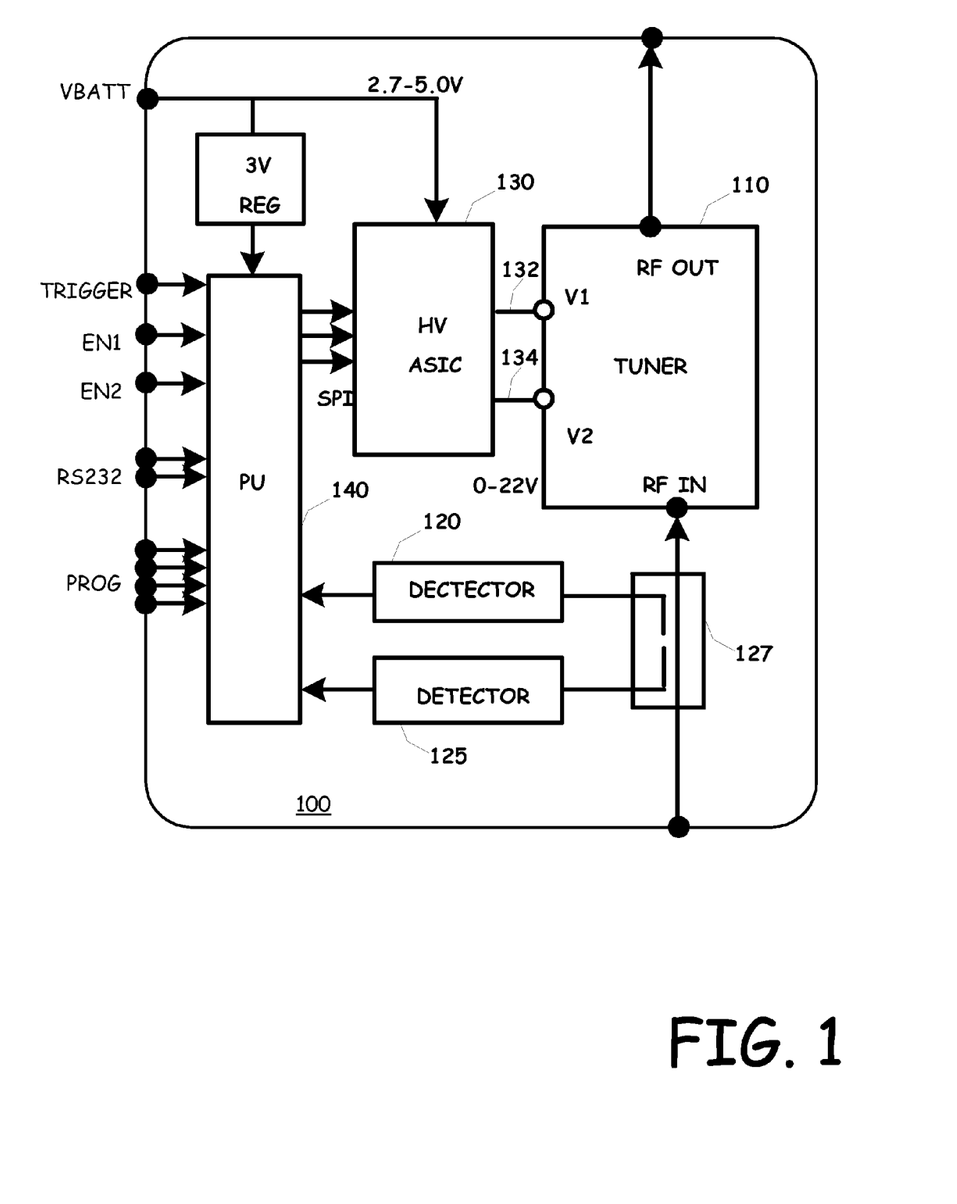
FIG. 1 is a block diagram illustrating an exemplary environment for deployment of one or more embodiments of the present invention.

FIG. 1 is a block diagram illustrating an exemplary environment for deployment of one or more embodiments of the present invention. The illustrated embodiment includes an adaptive impedance matching module (AIMM) 100, however, it should be appreciated that the invention can be incorporated into embodiments that utilize discrete components, integrated circuits, a combination of software, firmware and hardware, or the like, and that the embodiment presented as a module is a non-limiting example. Further, although the present invention is described within the context of an AIMM, it will be appreciated that various aspects, features and embodiments equally apply to other configurations. The AIMM 100 includes a tuner 110 that includes a matching circuit with one or more tunable elements or components. An exemplary embodiment of a tuner includes tunable capacitances and more specifically, two tunable capacitances, but it will be appreciated that the present invention can be applied to a wide variety of tunable impedance matching circuits. Operating in conjunction with sensor 127, a first detector 120 is used to detect the forward transmit power and a second detector 125 is used to detect the reflected transmit power. These values are measured in order to determine the transmitter return loss (i.e., TxRL=20 Log |S11|) where S11 is known by those skilled in the art to be the ratio between the reflected and incident power on port 1. The environment may further include a high-voltage ASIC (HV-ASIC) 130 containing a DC/DC converter and at least two DACs to generate the high voltage bias signals 132 and 134 required to control the tunable components. A micro-controller, microprocessor or other processing unit (PU) 140 receives output signals from the forward detector 120 and the reflected detector 125 and can calculate the reflected loss of the transmitted signal and thus, characterize the impedance matching of the circuit. Not illustrated, the PU 140 also interfaces or includes one or more memory elements including, but not limited to various forms of volatile and non-volatile memory. For instance, the PU may periodically write values to memory and read values from memory, such as settings for the variable components in the AIMM.

Figure 2:
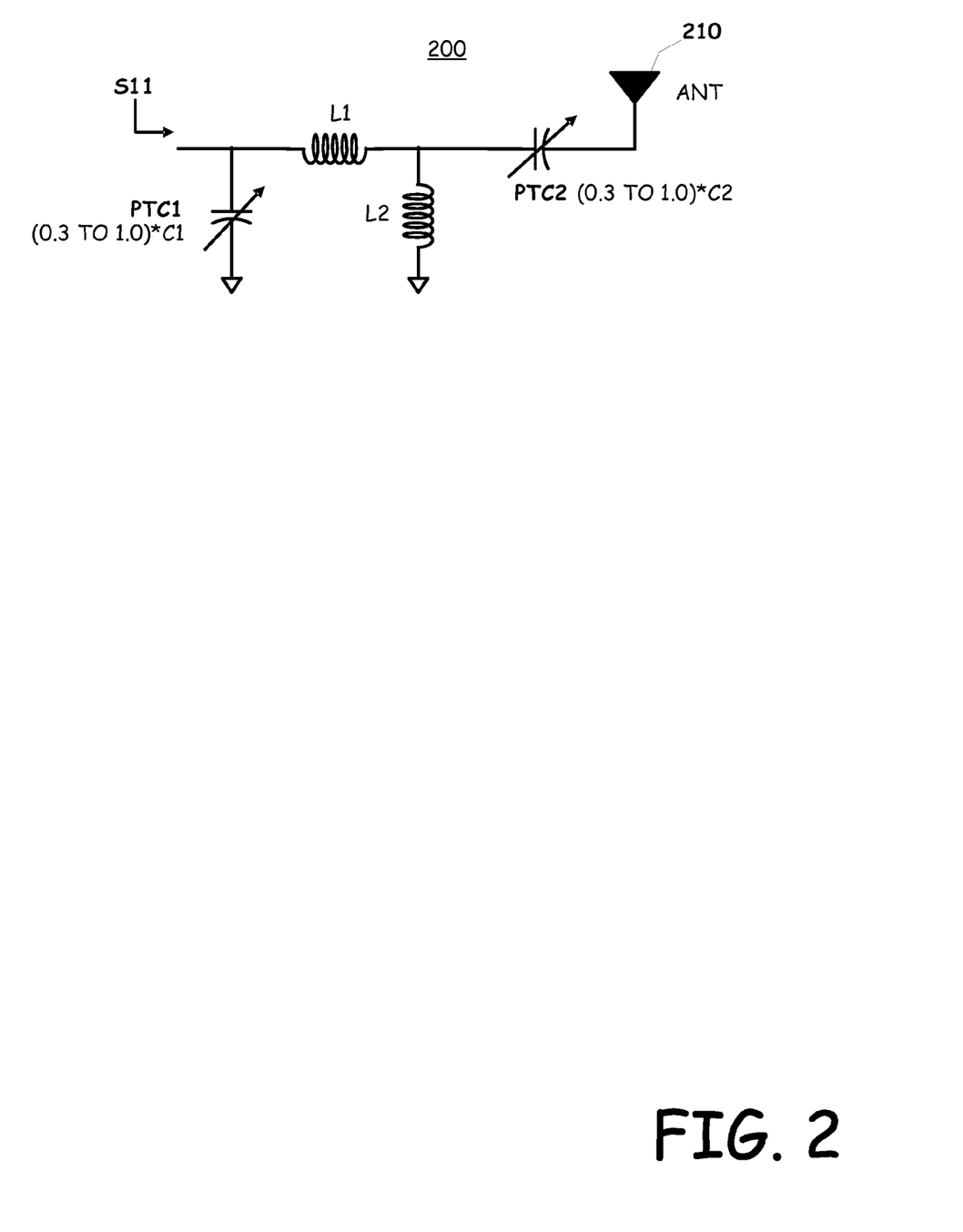
FIG. 2 is a circuit diagram illustrating further details of an exemplary matching circuit that could be included in the AIMM in an exemplary embodiment of the present invention.

FIG. 2 is a circuit diagram illustrating further details of an exemplary matching circuit 200 that could be included in the AIMM 100 for an exemplary embodiment of the present invention. The illustrated matching circuit 200 includes a first tunable capacitance PTC1, a first impedance L1, a second impedance L2 and a second tunable capacitance PTC2 where PTC is a Paratek Tunable Capacitor. The first tunable capacitance PTC1 is coupled to ground on one end and to the output of a transceiver on the other end. The node of PTC1 that is coupled to the transceiver is also connected to a first end of the first impedance L1. The second impedance L2 is connected between the second end of the first impedance L1 and ground. The second end of the first impedance L1 is also coupled to a first end of the second tunable capacitance PTC2. The second end of the second tunable capacitance PTC2 is then coupled to an antenna 210. The tunable capacitances can be tuned over a range such as 0.3 to 1 times a nominal value C. For instance, if the nominal value of the tunable capacitance is 5 pF, the tunable range would be from 1.5 to 5 pF. In an exemplary embodiment of the present invention, PTC1 has a nominal capacitance of 5 pf and is tunable over the 0.3 to 1 times range, the first impedance L1 as a value of 3.1 nH, and the second impedance L2 has a value of 2.4 nH and the second tunable capacitance PTC2 has a nominal value of 20 pF and can be tuned over a range of 0.3 to 1 times the nominal value. It will be appreciated that the tunable capacitances in the illustrated embodiment could be tuned oar adjusted over their ranges in an effort to optimize the matching characteristics of the AIMM under various operating conditions. Thus, under various use conditions, operating environments and at various frequencies of operation, the tunable capacitances can be adjusted to optimize performance or attain a desired level of performance.

Figure 3:
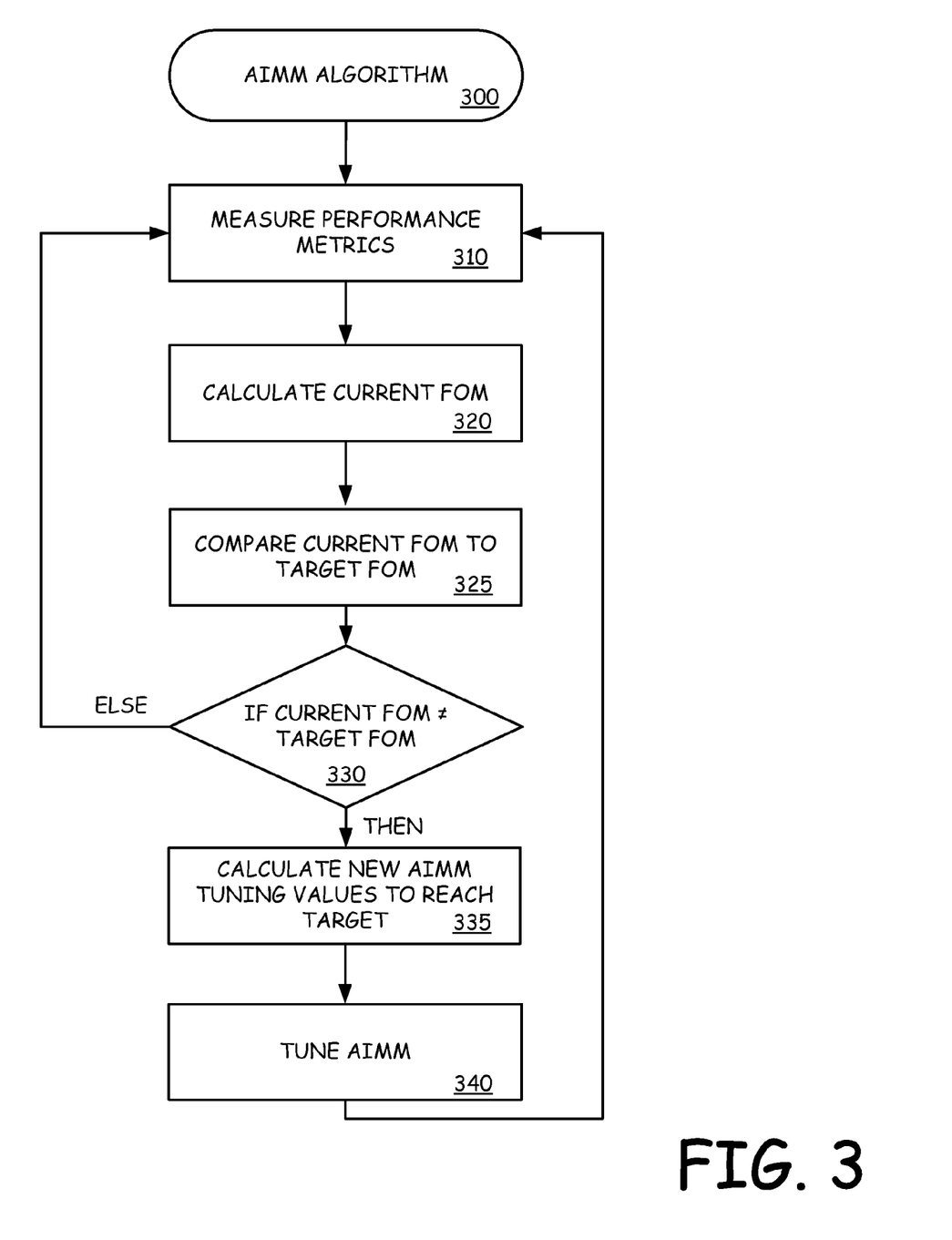
FIG. 3 is a flow diagram illustrating the general steps taken in an exemplary embodiment of the present invention.

FIG. 3 is a flow diagram illustrating the general steps taken in an exemplary embodiment of the present invention. The basic flow of the algorithm 300 initially includes measuring the performance parameters or metrics 310 used as feedback pertaining to the performance of the AIMM or the impedance match between a transceiver and an antenna. The performance metrics utilized may vary over embodiments of the present invention, over various usage scenarios, over technology being utilized (i.e. FDM, TDM, etc.), based on system settings and/or carrier requirements, etc. For instance, in an exemplary embodiment of the present invention, the performance metrics include one or more of the following transmitter related metrics: the transmitter return loss, output power, current drain, and transmitter linearity.

Next, a current figure of merit (FOM) is calculated 320. The current FOM is based on the one or more performanc metrics, as well as other criteria. The current FOM is then compared to a target FOM 325. The target FOM is the optimal or desired performance requirements or objective for the system. As such, the target FOM can be defined by a weighted combination of any measurable or predictable metrics. For instance, if it is desired to maximize the efficiency of the transmitter, the target FOM can be defined to result in tuning the matching network accordingly. Thus, depending on the goal or objective, the target FOM can be defined to tune the matching network to achieve particular goals or objectives. As a non-limiting example, the objectives may focus on total radiated power (TRP), total isotropic sensitivity (TIS), efficiency and linearity. Furthermore, the target FOM may be significantly different for a TDM system and an FDM system. It should be understood that the target FOM may be calculated or selected on the fly based on various operating conditions, prior measurements, and modes of operation or, the target FOM could be determined at design time and hard-coded into the AIMM 100.

If it is determined that the current FOM is not equal to the target FOM, or at least within a threshold value of the target FOM 330, new tuning values for the AIMM 100 are calculated or selected 335. However, if the current FOM is equal to or within the defined threshold, then processing continues by once again measuring the performance metrics 310 and repeating the process. Finally, if the current FOM needs to be adjusted towards the target FOM, the AIMM 100 is adjusted with the new tuning values in an effort to attain or achieve operation at the target FOM 340. In some embodiments, this new tuning value may also be stored as a new default tuning value of the transmitter at the given state of operation. For instance, in one embodiment, a single default value can be used for all situations, and as such, the latest tuning values could be stored in the variable location. In other embodiments, a default tuning state may be maintained for a variety of operational states, such as band of operation, use case scenario (i.e., hand held, antenna up/down, slider in/out, etc.) and depending on the current operational state, the new tuning values may be stored into the appropriate default variable.

In one exemplary embodiment, the AIMM 100 is adjusted by tuning one or more of the tunable components 340, measuring the new FOM (i.e., based on the transmitter reflected loss) 320-330, and re-adjusting or retuning the AIMM 100 accordingly 335-340 in a continuous loop. This process is referred to as walking the matching circuit because is moves the circuit from a non-matched state towards a matched state one step at a time. This process is continued or repeated to attain and/or maintain performance at the target FOM. Thus, the process identified by steps 310 to 340 can be repeated periodically, a periodically, as needed, or otherwise. The looping is beneficial because even if performance at the target FOM is attained, adjustments may be necessary as the mode of operation (such as usage conditions) of the device change and/or the performance of the transmitter, the antenna and the matching circuitry change over time. In other embodiments, the tunable components can be set based on look-up tables or a combination of look-up tables and performing fine-tuning adjustments. For instance, the step of calculating the AIMM tuning values 335 may involve accessing initial values from a look-up table and then, on subsequent loops through the process, fine tuning the values of the components in the AIMM 100.

In an exemplary embodiment of the present invention operating within a TDM environment, the AIMM 100 can be adjusted to optimize the operation of the transmitter during the transmit time slot. In such an embodiment, the performance metric may simply be the transmitter return loss. In addition, the target FOM in such an embodiment may also simply be a function of the transmitter return loss. In this exemplary embodiment, the AIMM 100 can be tuned to minimize the FOM or the transmitter return loss.

More particularly, for the circuit illustrated in FIG. 2, this embodiment of the present invention can operate to tune the values of PTC1 and PTC2 to minimize the transmitter return loss during the transmit time slot. For this particular example, the algorithm of FIG. 3 includes measuring the transmitter return loss, calculating adjustment values for PTC1 and PTC2 to optimize a FOM that is a function of the transmitter return loss, tuning the AIMM 100 by adjusting the values of PTC1 and PTC2 and then repeating the process.

The adjustment values for PTC1 and PTC2 can be determined in a variety of manners. For instance, in one embodiment of the invention the values may be stored in memory for various transmitter frequencies and usage scenarios. In other embodiments, the values may be heuristically determined on the fly by making adjustments to the tuning circuit, observing the effect on the transmitter return loss, and compensating accordingly. In yet another embodiment, a combination of a look-up table combined with heuristically determined fine tuning can be used to adjust the AIMM 100.

During the receiver time slot, the AIMM 100 can be readjusted to optimize or improve the performance of the receiver. Although, similar to the adjustments during the transmit time slot, particular performance parameters may be measured and used to calculate a current FOM, as previously mentioned it is difficult to measure such performance parameters for the receiver. As such, an exemplary embodiment of the present invention operates to apply a translation to the tuning values of the AIMM 100 derived at during the transmitter time slot, to improve the performance during the receive time slot. During the design of the transmitter and receiver circuitry, the characteristics of performance between the transmitter operation and receiver operation can be characterized. This characterization can then be used to identify an appropriate translation to be applied. The translation may be selected as a single value that is applicable for all operational states and use cases or, individual values can be determined for various operational states and use cases.

Figure 4:
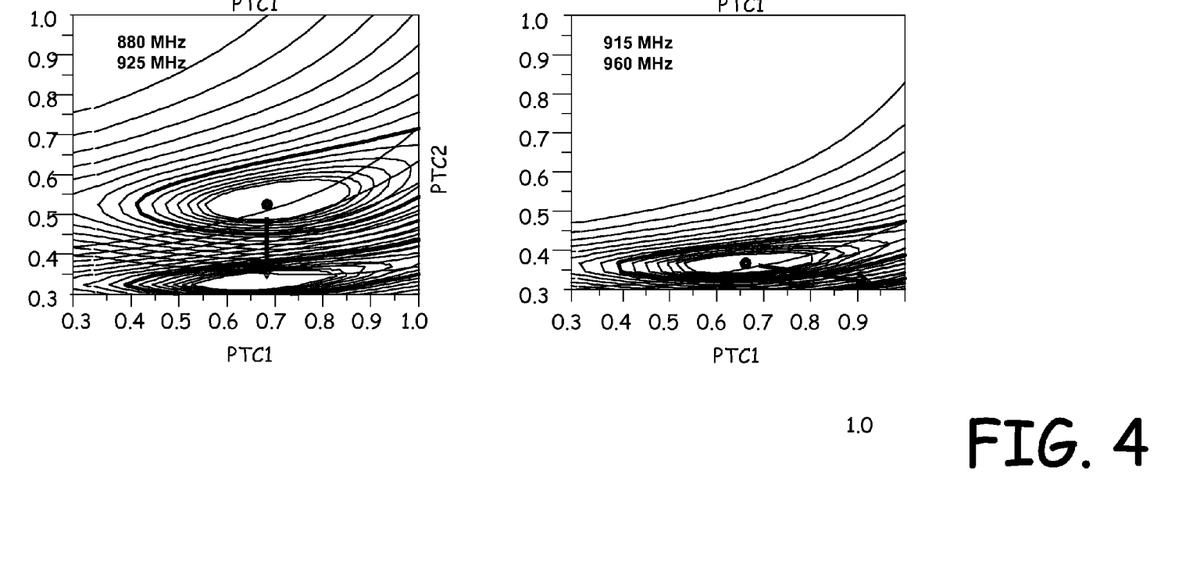
FIG. 4 and FIG. 4A are a plots of the transmitter reflection losses for four operating frequencies.
Figure 4A:
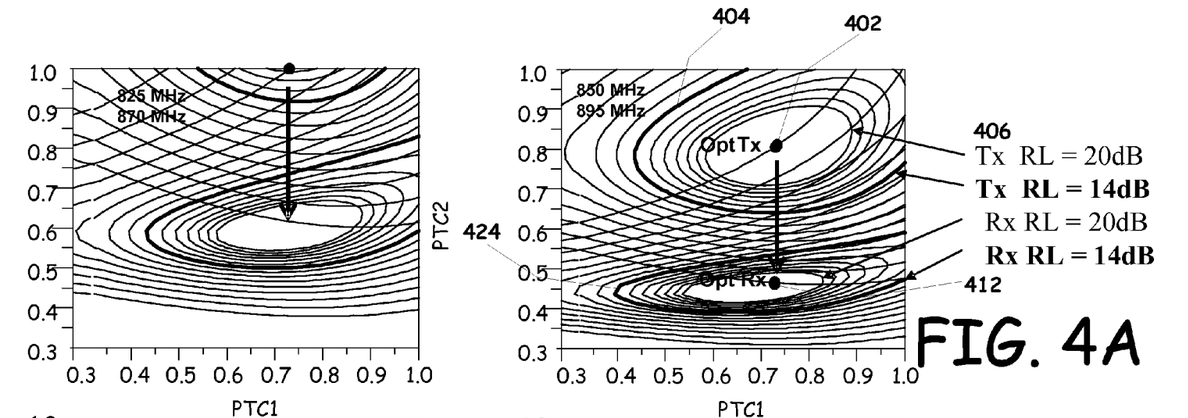

FIG. 4 is a plot of the transmitter reflection losses for four operating frequencies of a transceiver. The contours show the increasing magnitude of the reflection loss in 1 dB increments. For instance, in FIG. 4A, the inside contour for the transmitter 406 is 20 dB and the bolded contour is 404 14 dB. Obviously, operation at the center of the contours 402 is optimal during transmitter operation. In the illustrated example, it is apparent that simply by adjusting the value of PTC2 by adding an offset, significant performance improvements can be achieved in the receiver time slot by moving the operation towards point 412. The translation varies depending on a variety of circumstances and modes of operation including the frequency of operation, and similarly, may vary based on usage of the device housing the circuitry. In the illustrated example, the performance is determined to be greatly improved for the receiver time slot if the value of PTC2 for receiver operation is adjusted to be 0.6 times the value of PTC2 used for the optimal transmitter setting and the value of PTC 1 remains the same. This is true for each of the illustrated cases except at the 915 MHz/960 MHz operational state. At 960 MHz, it is apparent that significant receiver improvement can be realized by also adjusting the value of PTC1 from its transmitter value. In the illustrated example, by examining the characteristics of the circuitry it can be empirically derived that a suitable equation for operation of the receiver at 960 MHz is:

$$PTC1\_Rx = PTC1\_Tx + 1 - 1.8 * PTC2\_Tx.$$

It should be noted that this equation is only a non-limiting example of an equation that could be used for a particular circuit under particular operating conditions and the present invention is not limited to utilization of this particular equation.

Figure 5:
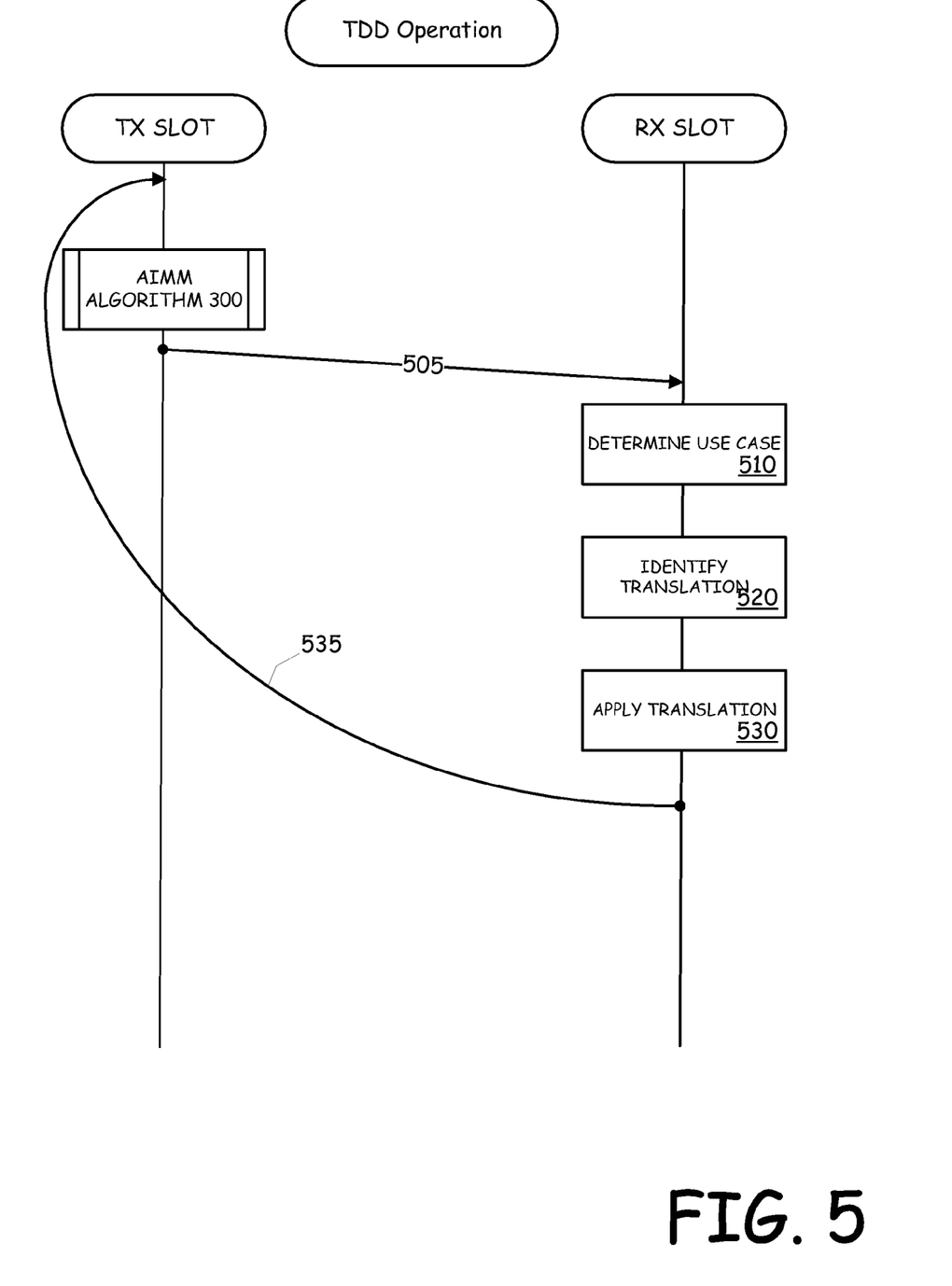
FIG. 5 is a flow diagram illustrating the steps involved in an exemplary embodiment of the present invention operating in a TDM environment.

FIG. 5 is a flow diagram illustrating the steps involved in an exemplary embodiment of the present invention operating in a TDM environment. During the transmitter time slot, the AIMM algorithm presented in FIG. 3, or some other suitable algorithm, can be applied on a continual basis to move operation of the transmitter towards the target FOM. However, when the receive time slot is activated 505, the AIMM should be adjusted to match for the receiver frequency. The adjustment to the receiver mode of operation may initially involve determining the current operating conditions of the device 510. Based on the current operating conditions, a translation for tuning of the various circuits in the AIMM 100 are identified 520. For instance, various states, components or conditions can be sensed and analyzed to determine or detect a current state or a current use case for the device. Based on this information, a particular translation value or function may be retrieved and applied. It should also be appreciated that such translations can be determined during the design phase and loaded into the device. Finally, the translations are applied to the AIMM 100 530. When operation returns to the transmitter time slot 535, the AIMM algorithm again takes over to optimize operation based on the target FOM.

It should be understood that the translation applied to tuning of the AIMM 100 during the receiver time slot is based on the particular circuit and device and can be determined during design or even on an individual basis during manufacturing and testing. As such, the specific translations identified herein are for illustrative purposes only and should not be construed to limit the operation of the present invention.

Thus, for TDM systems, embodiments of the present invention operate to optimize operation of a device by tuning the matching circuit for an antenna to optimize operation based on a target FOM. During the receiver time slot, a translation is applied to the tuned components to improve receiver performance. The target FOM can be based on a variety of performance metrics and a typical such metric is the reflection loss of the transmitter. The values for the tuned components can be set based on operational conditions and using a look-up table, can be initially set by using such a look-up table and then heuristically fine tuned, or may be heuristically determined on the fly during operation. The translations applied during the receiver operation are determined empirically based on the design of the circuitry and/or testing and measurements of the operation of the circuit. However, a unique aspect of the present invention is tuning of the matching circuit during transmit mode and based on non-receiver related metrics and then retuning the circuit during receive mode operation based on a translation to optimize or attain a desired level of receiver operation.

In an exemplary embodiment of the present invention operating within an FDM environment, the AIMM 100 can be adjusted to so that the matching characteristics represent a compromise between optimal transmitter and receiver operation. Several techniques can be applied to achieve this compromise. In one technique, the translation applied in the TDM example could be modified to adjust the AIMM 100 as a compromise between the optimal transmit and receive settings. For instance, in the example illustrated in FIG. 2, the value of PTC1 and PTC2 can be determined and adjusted periodically, similar to TDM operation (even though such action would temporarily have an adverse effect on the receiver). Then, a translation could be applied to the values of PTC1 and PTC2 for the majority of the operation time. For instance, in the TDM example shown in FIG. 4, the transmitter values were adjusted by multiplying the PTC2 value by 0.6 in three modes of operation and using the above-identified equation during a forth mode of operation. This same scheme could be used in the FDM mode of operation however, the scaling factor would be different to obtain operation that is compromised between the optimal transmitter setting and optimal receiver setting. For example, multiplying the PTC2 value by 0.8 could attain an acceptable compromise.

However, another technique of an embodiment of the present invention is to apply an algorithm that operates to attain a target FOM that is based on one or more transmitter related metrics (such as return loss) and the values of the adjustable components in the AIMM. Advantageously, this aspect of the present invention continuously attempts to maintain a compromised state of operation that keeps the operation of the transmitter and the receiver at a particular target FOM that represents a compromise performance metric level.

In the particular example illustrated in FIG. 2, such an algorithm could be based on a target FOM that is an expression consisting of the transmitter return loss and the values of PTC1 and PTC2. Because the algorithm is not operating to minimize the transmitter return loss in this embodiment of an FDM system, a compromised value is specified. For instance, a specific target transmitter return loss can be pursued for both transmitter and receiver operation by tuning the AIMM based on a FOM that is not only a function of the return loss, but also a function of the values of PTC1 and PTC2 that will encourage operation at a specific level. The target FOM is attained when the actual transmitter return loss is equal to the target transmitter return loss and, specified preferences for PTC1 and PTC2 are satisfied. The preferences illustrated are for the value of PTC1 to be the highest possible value and the value of PTC2 to be the lowest possible value while maintaining the transmit return loss at the target value and satisfying the PTC1 and PTC2 preferences.

Figure 6:
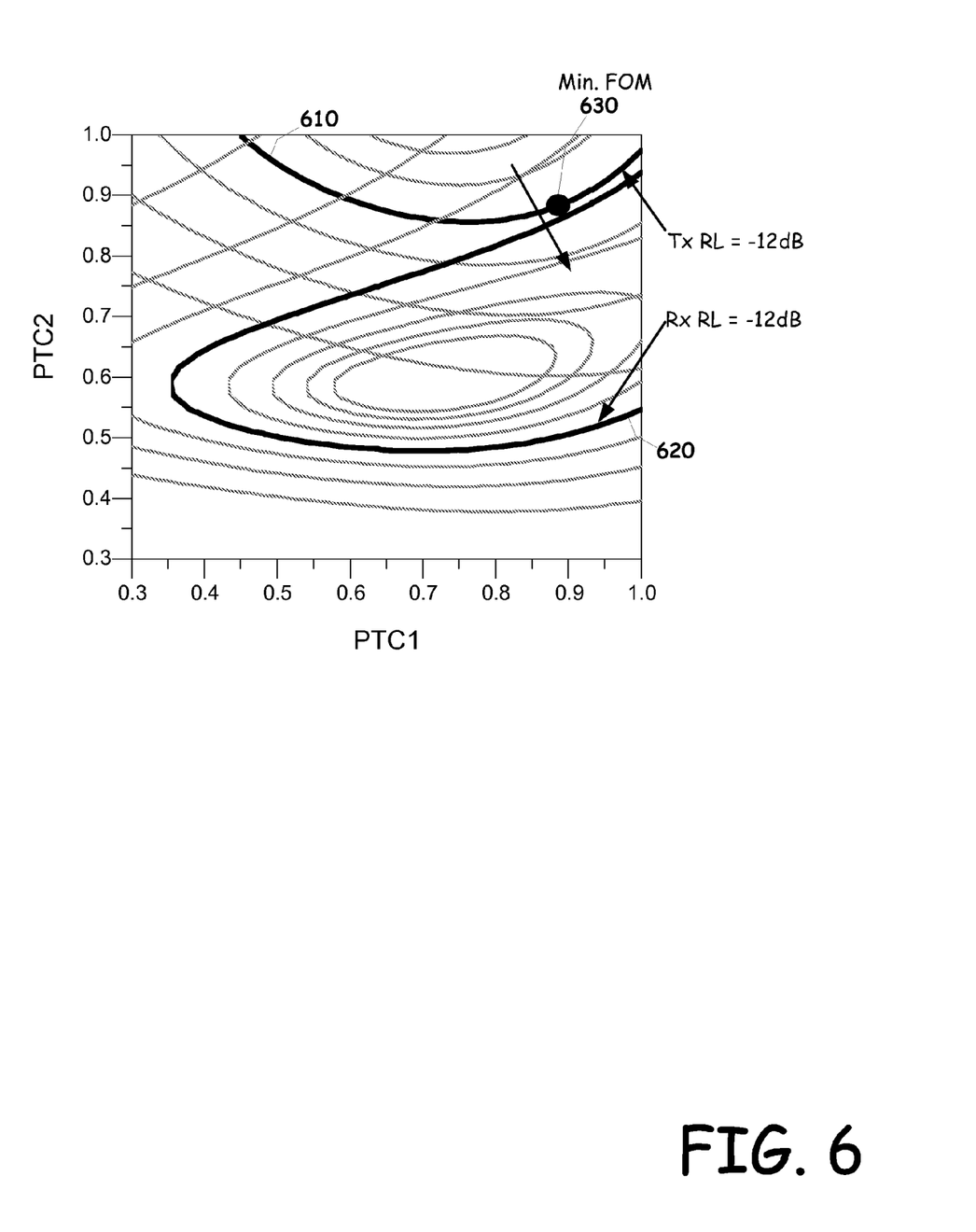
FIG. 6 is a return loss contour diagram in the PTC plane for a particular frequency (i.e., 825 MHz/870 MHz operation).

FIG. 6 is a return loss contour diagram in the PTC plane for a particular frequency (i.e., 825 MHz/870 MHz operation). Obviously, optimal operation in an FDM system cannot typically be attained because the settings for optimal transmitter operation most likely do not coincide with those for optimal receiver operation. As such, a compromise is typically selected. For instance, a compromise may include operating the transmitter at a target return loss value of −12 dB and at a point at which the transmitter −12 dB contour is closest to a desired receiver contour (i.e., −12 dB).

The operational goal of the system is to attempt to maintain the matching circuit at a point where the operational metrics for the transmitter are at a target value (eg. −12 dB) and the estimated desired receiver operation is most proximate. In an exemplary embodiment of the present invention, an equation used to express the target FOM for such an arrangement can be stated as follows:

Target $FOM = f(Tx\_RL, TX\_RL\_Target) + f(PTC2, PTC1)$

Where:
  TX_RL is the measure transmitter return loss
  TX_RL_Target is the targeted transmitter return loss In an exemplary embodiment suitable for the circuit provided in FIG. 2, the FOM may be expressed as:

$FOM = (Tx\_RL - Tx\_RL\_Target) + C2*PTC2 - C1*PTC1$, where,

C1 and C2 are preference constants or scaled values, and if $Tx\_RL > Tx\_RL\_Target$ then $Tx\_RL = Tx\_RL\_Target$.

In operation, exemplary embodiments of the present invention optimize the transmitter based on the target reflected loss to attain operation on the desired contour 610 (as shown in FIG. 6) and also adjusts the values of PTC1 and PTC2 to attain operation at the desired location 630 (or minimum FOM) on the contour. The portion of the FOM equation including the TxRL and TX_RL_Target values ensures operation on the targeted RL contour 610 (i.e., the −12 db RL contour). By observing the contour 610, it is quite apparent that not all points on the target reflected loss contour have the same value for the PTC1 and PTC2. Because of this, the values of PTC1 and PTC2 can be incorporated into the target FOM equation to force or encourage operation at a particular location on the reflected loss contour. In the illustrated example, the target FOM is the point at which the reflected loss contour is closest to the expected same valued reflected loss contour for the receiver. However, it will be appreciated that other performance goals may also be sought and the present invention is not limited to this particular example. For instance, in other embodiments, the target FOM may be selected to encourage operation at a mid-point between optimal transmitter performance and expected optimal receiver performance. In yet another embodiment, the target FOM may be selected to encourage operation at a point that is mid-point between a desired transmitter metric and an estimated or measured equivalent for the receiver metric.

In the provided example illustrated in FIG. 6, the optimum, compromised or desired point on the target contour is the point that minimizes the value of PTC2 and maximizes the value of PTC1 in accordance with the equation C2*PTC2−C1*PTC1. Thus, the portion of the expression including PTC1 and PTC2 ensures that operation is at a particular location on the contour that is desired—namely on the lower portion of the contour and closest to the RX_RL contour 620. In general, the algorithm operates to optimize the current FOM or, more particularly in the illustrated embodiment, to minimize the expression of C2*PTC2—C1*PTC1 as long as the desired TX_RL parameter is also met. It should be appreciated that the details associated with this example are associated with a specific circuit design and a wide variety of relationships between the adjustable components of the AIMM would apply on a circuit by circuit basis and as such, the present invention is not limited to this specific example.

Another embodiment of the present invention may take into consideration historical performance of the tunable components as well as current values. As an example, as the tunable components are adjusted, changes in the current FOM will occur in a particular direction (i.e., better or worse). As an example, if the AIMM adjustments 26 result in the current FOM falling on the top portion of a desired performance contour, making a particular adjustment may result in making the current FOM worse or better. If the adjustment was known to cause a certain result when the current FOM is located on the bottom of the contour and this time, the opposite result occurs, then this knowledge can help identify where the current FOM is located on the contour. Thus, knowing this information can be used in combination with the operation metric to attain the operation at the target FOM. For instance, the target FOM may be a function of the operational metrics, the current states of the tunable components, and the knowledge of previous results from adjusting the tunable components.

Stated another way, when a current FOM is calculated, the adjustments to reach the target FOM may take into consideration past reactions to previous adjustments. Thus, the adjustment to the tunable components may be a function of the FOM associated with a current setting and, the change in the current FOM resulting from previous changes to the tunable components.

In another embodiment of the present invention operating in an FDM environment, the FOM may be optimized similar to operation in the TDM environment. For example, the FOM may be a function of the transmitter reflected loss metric and the system may function to optimize the FOM based on this metric. Once optimized, the tunable components can be adjusted based on a predetermined translation to move the FOM from the optimized for the transmitter position to a position that is somewhere between the optimal transmitter setting and the optimal receiver setting.

Figure 7:
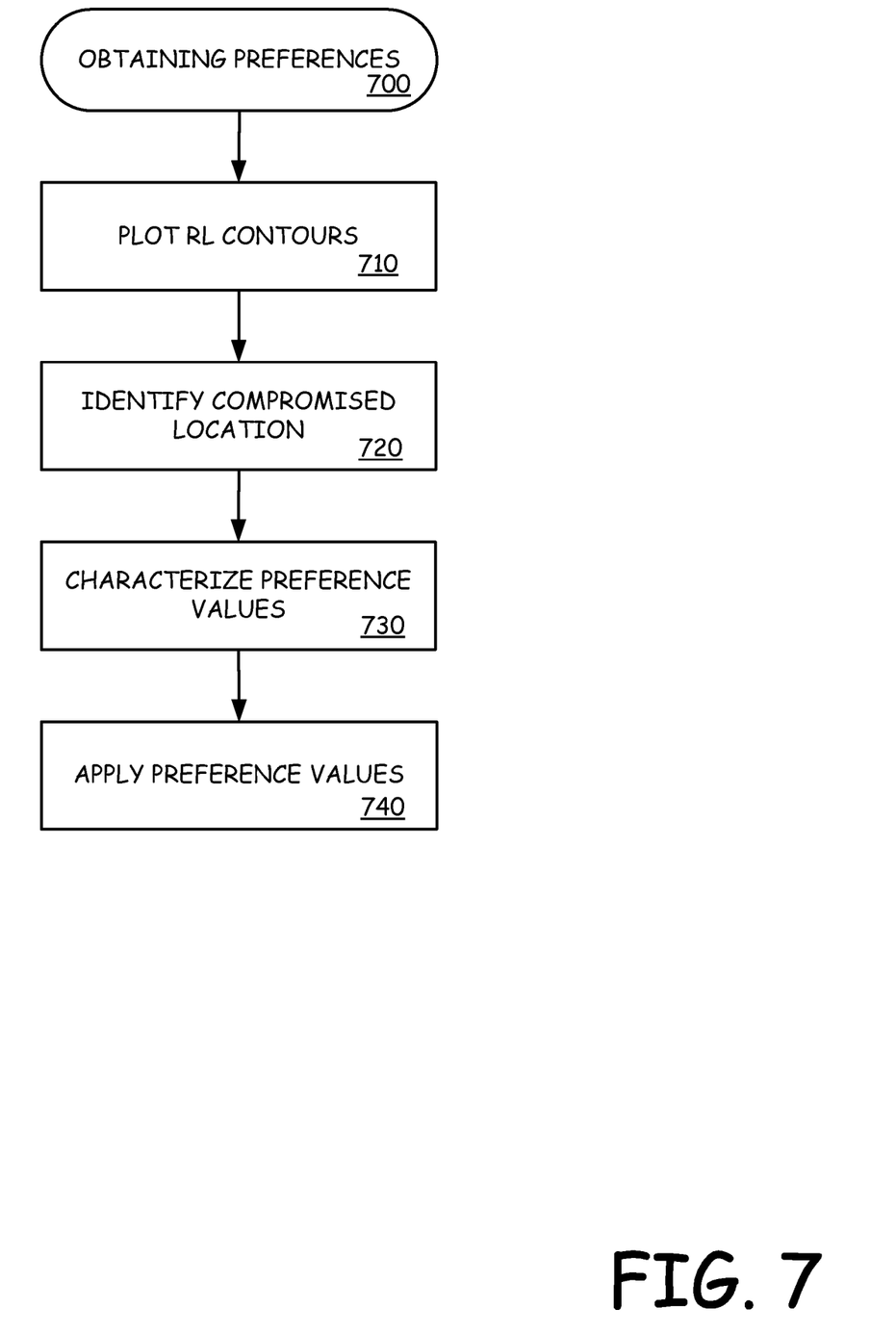
FIG. 7 is a flow diagram illustrating the steps involved in an exemplary embodiment of the present invention in obtaining the preference values for PTC1 and PTC2.

FIG. 7 is a flow diagram illustrating the steps involved in an exemplary embodiment of the present invention in obtaining the preference values for PTC1 and PTC2. Initially, the process 700 involves plotting of the return loss contours for the various modes of operation, or a reasonable subset thereof 710. FIG. 6 is an example of such a plot generated as a result of performing this step. Next, the compromised tuning location is identified 720. As previously mentioned, a variety of factors may be weighed to determine the compromised tuning location and one example, as illustrated in FIG. 6, is the point at which a target reflected loss for the transmitter is the most proximate to a target reflected loss for the receiver. In a typical embodiment, this is the point at which the target transmitter and receiver contours at the desired reflected loss are closest to each other and nearly parallel. Once the compromised location is determined, the preference values can be characterized 730. For instance, in the example in FIG. 6, by drawing a perpendicular line between the two contours and passing through the compromised location, the slope and hence the preferences can be identified. These preference values can then be determined and then applied across the broad spectrum of frequencies and usage scenarios 740.

It should be appreciated that the values of C1 and C2 are constants and can vary among embodiments of the invention, as well as among devices employing the invention. As such, the values are determined empirically as described above. In an exemplary embodiment, the values of C1 and C2 are 0.7 and 2 respectively for a given circuit and a given antenna, given mode of operation, etc. Thus, any given set of constants are determined empirically and only apply to a specific antenna design, circuit and mode of operation and, although the use of these specific values may in and of itself be considered novel, the present invention is not limited to the particular expression. In fact, depending on particular goals, design criteria, operational requirements, etc. different values may be required to attain the compromised performance. It will also be appreciated that in various embodiments, it may be desired to have a different targeted reflection loss for the transmitter than for the receiver.

Figure 8:
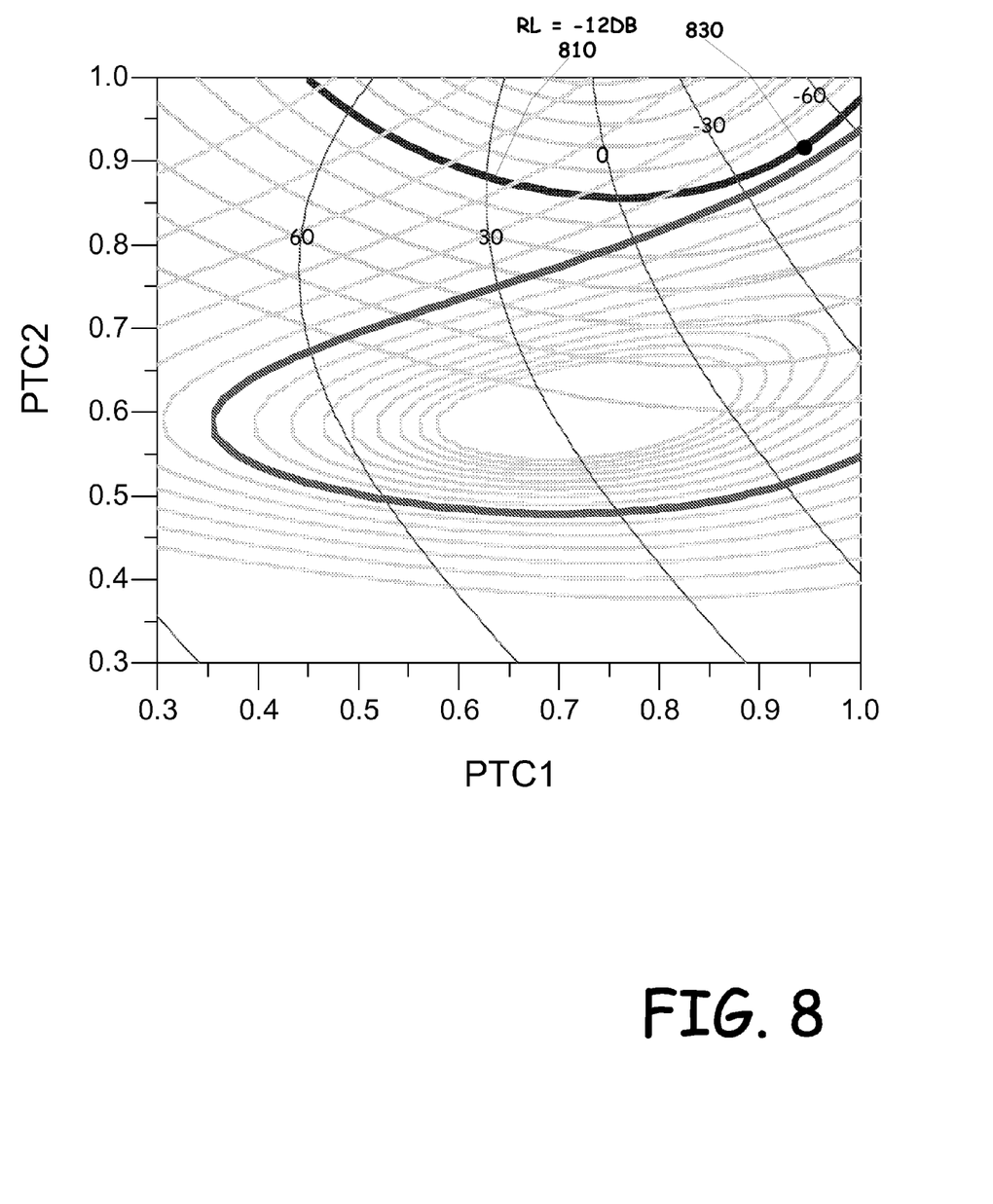
FIG. 8 is a contour plot showing the magnitude and the phase of the reflection coefficient.

In another embodiment of the present invention, rather than analyzing the transmitter reflected power as the performance metric, the reflection coefficient vector may be measured. In this embodiment, the phase information of the reflection coefficient may be included within the FOM. For example, FIG. 8 is a contour plot showing the magnitude and the phase of the reflection coefficient. The preferred point of operation 830 is shown as falling on the −12 dB contour 810 and at a phase of 45 degrees. In such an embodiment, the components of the matching circuit of the AIMM 100 can be adjusted to meet a reflected loss value that falls on the −12 db contour and that also approaches the specific point on the contour—namely at the point where the reflection coefficient differs by 45 degrees.

As mentioned, mobile and transportable transceivers are subjected to a variety of use cases. For instance, a typical cellular telephone could be operated in various scenarios including speaker phone mode, ear budded, with the antenna in the up position or the down position, in the user's hand, holster, pocket, with a slider closed or extended, in a holster or out of a holster, etc. All of these scenarios, as well as a variety of other environmental circumstances can drastically alter the matching characteristics of the cellular telephone's antenna circuitry. As such, not only do the various embodiments of the present invention operate to tune the matching circuitry based on the operational frequency, but in addition, adjust the matching characteristics based on changes in the modes of operation. Advantageously, this greatly improves the performance of the device without requiring separate matching circuitry for the various modes of operation of the device. Thus, it will be appreciated that various other parameters can be monitored to identify various use cases and then adjustments to the tuning circuitry can be immediately deployed followed by fine tuning adjustments to optimize the FOM. The other parameters in which the embodiments of the present invention may function are referred to as modes of operation. The various modes of operation include the use cases as previously described, along with operating environments, bands of operation, channel frequencies, modulation formats and schemes, and physical environments. Thus, the various embodiments of the present invention may make changes, select default values, calculate adjustment values, etc., all as a function of one or more of the modes of operation.

One embodiment of the present invention may maintain a set of initial starting values based on the various use cases and operational environments. For instance, each use case may include a default value. Upon detection or activation of the device in a new use case, the default value is obtained from memory and the components in the AIMM are tuned accordingly. From that point on, the adjustment algorithm can then commence fine tuning of the operation. As previously mentioned, each time the target FOM is attained for a particular use case, the new values may be written into the default location as the new default values. Thus, every time the operational state of the device changes, such as changing between bands of operation etc., the default values are obtained and applied, and then adjustments can resume or, operation can simply be held at the default value.

Numerous specific details have now been set forth to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the description, it is appreciated that throughout the specification discussions that different electronic devices could be used to create a variable tuner network. The embodiments used in the examples discussed were specific to variable capacitor devices, however variable inductors, or other tunable networks, built out of elements such as Micro-Electro-Mechanical Systems (MEMS) and/or other tunable variable impedance networks could be used in such an AIMM system.

Unless specifically stated otherwise, as apparent from the description, it is appreciated that throughout the specification discussions utilizing terms such as "processing," "computing," "calculating," "determining," or the like, refer to the action and/or processes of a microprocessor, microcontroller, computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause an effect relationship).

In the description and claims of the present application, each of the verbs, "comprise," "include," and "have", and conjugates thereof, are used to indicate that the object or objects of the verb are not necessarily a complete listing of members, components, elements, or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

It will be appreciated by persons skilled in the art that the present invention is not limited by what has been particularly shown and described herein above. Rather the scope of the invention is defined by the claims that follow.

What is claimed is:

1. A method for controlling a matching circuit for interfacing an antenna with a transceiver in a communication device, the matching circuit including at least one variable component, the method comprising:
   obtaining at least one operational metric for a transmitter;
   calculating a current figure of merit as a function of the at least one operational metric;
   determining a target figure of merit based on a weighted combination of measured metrics associated with the communication device;
   comparing the current figure of merit to the target figure of merit; and
   adjusting a setting of the at least one variable component to a value expected to change the current figure of merit relative to the target figure of merit, whereby the receiver operation and transmitter operation are adjusted based on transmitter operational metrics without utilizing operational metrics measured for the receiver operation.

2. The method of claim 1, further comprising repeating the process to adjust the matching circuit by obtaining a next at least one operational metric for the transmitter, wherein the target figure of merit is a function of at least one of total radiated power and total isotropic sensitivity, and wherein the measured metrics associated with the communication device include the at least one operational metric.

3. The method of claim 2, wherein the matching circuit operates in a time division multiplexed system and wherein the step of adjusting the setting is performed during a transmit time slot, and further comprising the step of modifying the setting as a function of the adjustment value for use during a receive time slot to improve the performance of the receiver.

4. The method of claim 3, wherein the operational metric comprises transmitter reflection loss.

5. The method of claim 3, wherein the operational metric comprises output power of the transmitter.

6. The method of claim 3, wherein the operational metric comprises current drain.

7. The method of claim 3, wherein the operational metric comprises transmitter linearity.

8. The method of claim 3, wherein the step of modifying the setting as a function of the adjustment value further comprises determining a change in the value that is proximate to tuning the matching circuit to a point that minimizes the receiver reflection loss.

9. The method of claim 8, wherein the step of determining a change in the value further comprises determining a change in the value as a function of one or more modes of operation.

10. The method of claim 8, wherein the step of determining a change in the value further comprises detecting a current mode of operation and selecting a change in the value based on the detected mode of operation.

11. The method of claim 2, wherein the matching circuit operates in a frequency division multiplexed system in which the transmit frequency is different than the receive frequency and the current figure of merit is a function of one or more transmitter metrics and preferences for the value of the one or more variable components.

12. The method of claim 11, wherein the step of adjusting the setting of the at least one variable component attains a compromise between transmitter and receiver performance by approaching a target figure of merit existing at an operational point at which the transmitter reflection loss and the receiver reflection loss are proximate to a respective target reflection loss for the transmitter and the receiver.

13. The method of claim 11, wherein the operational metric comprises the transmitter reflection loss.

14. The method of claim 11, wherein the operational metric comprises the output power of the transmitter.

15. The method of claim 11, wherein the operational metric comprises the current drain.

16. The method of claim 11, wherein the operational metric comprises the transmitter linearity.

17. The method of claim 1, wherein the matching circuit operates in a frequency division multiplexed system in which the transmit frequency is different than the receive frequency and the current figure of merit is a function of a magnitude and a phase of a transmitter reflection loss, and the step of adjusting the setting of the at least one variable component to a value expected to change the current figure of merit relative to the target figure of merit further comprises adjusting to optimize the current figure of merit by meeting a target magnitude and the target phase of the transmitter reflection loss.

18. The method of claim 1, wherein the step of adjusting the setting of the at least one variable component to a value expected to change the current figure of merit relative to the target figure of merit further comprises adjusting the setting to a value as a function of historical results of previous adjustments.

19. The method of claim 1, wherein the matching circuit operates in a frequency division multiplexed system in which the transmitter frequency is different than the receiver frequency and the current figure of merit is a function of target transmitter metrics and preferences for the value of the one or more variable components, and the step of adjusting the setting of the at least one variable component to a value expected to change the current figure of merit relative to the target figure of merit further comprises detecting a mode of operation and adjusting the settings to a value as a function of the detected mode of operation.

20. The method of claim 1, further comprising the step of storing the value for future use.

21. The method of claim 1, further comprising the step of storing the value and associating the value with a mode of operation.

22. The method of claim 21, further comprising the step of initially extracting a previously stored value associated with a current mode of operation and adjusting the setting of the one or more variable components to the extracted value prior to the step of detecting at least one operational metric for the transmitter.

23. The method of claim 1, wherein the matching circuit operates in a frequency division multiplexed system and the step of adjusting a setting of the at least one variable component to a value expected to change the current figure of merit relative to the target figure of merit further comprises the steps of:
  adjusting the setting to a value that optimizes the transmitter operation;
  modifying the setting as a function of the value that optimizes transmitter operation to attain a desired level of operation for both the transmitter and receiver.

* * * * *